US006850129B2

(12) United States Patent
Lagerstedt

(10) Patent No.: US 6,850,129 B2
(45) Date of Patent: Feb. 1, 2005

(54) DEVICE FOR COAXIAL CONNECTION

(75) Inventor: Anders Lagerstedt, Göteborg (SE)

(73) Assignee: SAAB Ericsson AB, Gothenburg (SE)

(*) Notice: Subject to any disclaimer, the term of this patent is extended or adjusted under 35 U.S.C. 154(b) by 0 days.

(21) Appl. No.: 10/250,947

(22) PCT Filed: Dec. 10, 2001

(86) PCT No.: PCT/SE01/02720

§ 371 (c)(1), (2), (4) Date: Jul. 9, 2003

(87) PCT Pub. No.: WO02/056423

PCT Pub. Date: Jul. 18, 2002

(65) Prior Publication Data

US 2004/0046619 A1 Mar. 11, 2004

(30) Foreign Application Priority Data

Jan. 9, 2001 (SE) .............................................. 0100056

(51) Int. Cl.[7] .................................................. H03H 7/38
(52) U.S. Cl. ......................................... 333/33; 333/260
(58) Field of Search ............................ 333/22 R, 24 C, 333/32, 33, 34, 127, 260, 261, 262; 439/63, 581, 582, 68

(56) References Cited

U.S. PATENT DOCUMENTS

| | | | | |
|---|---|---|---|---|
| 3,870,978 A | | 3/1975 | Dreyer | |
| 4,125,308 A | * | 11/1978 | Schilling | 439/63 |
| 4,556,625 A | * | 12/1985 | Lenox et al. | 430/145 |
| 4,995,815 A | * | 2/1991 | Buchanan et al. | 439/63 |
| 5,570,068 A | * | 10/1996 | Quan | 333/33 |
| 5,598,132 A | * | 1/1997 | Stabile | 333/22 R |
| 5,796,315 A | * | 8/1998 | Gordon et al. | 333/24 C |
| 5,797,765 A | * | 8/1998 | Barnett et al. | 439/63 |
| 5,897,384 A | * | 4/1999 | Hosler, Sr. | 439/63 |

* cited by examiner

*Primary Examiner*—Michael Tokar
*Assistant Examiner*—Linh Van Nguyen
(74) *Attorney, Agent, or Firm*—Swidler Berlin Shereff Friedman, LLP

(57) ABSTRACT

A device for a coaxial connection that is intended to connect a coaxial cable (6) to the conductive pattern (3$a$) of a circuit board and contains an outer conductor (1) with an inner conductor (4) that is insulated relative thereto. The device contains a longitudinal coupling element (8) that is axially slidably mounted in a recess (4$a$) in the inner conductor (4;6$a$) and arranged so as to be in capacitive communication with the inner conductor (4;6$a$) and connected to the conductive pattern (3$a$). A layer (7) of insulating material is arranged between the coupling element (8) and the recess (4$a$).

20 Claims, 2 Drawing Sheets

DEVICE FOR COAXIAL CONNECTION

CROSS-REFERENCE TO RELATED APPLICATIONS

The application is a 35 U.S.C. §371 National Phase Filing of PCT application PCT/SE01/02720, which claims priority to Swedish application SE 0100056-1, filed Jan. 9, 2001.

BACKGROUND OF THE INVENTION

This invention concerns a device for a coaxial connection that is intended for connecting a coaxial cable to the conductive pattern of a circuit board, and contains an outer conductor with an inner conductor that is insulated relative thereto.

A coaxial connection (coaxial connector) consists of an inner conductor and a connector housing that is insulated relative thereto. When the connector is connected to a circuit board, the inner conductor of the connector is normally soldered to the conductive pattern of the circuit board, while the connector housing is arranged in contact with the enclosure that surrounds the circuit board.

Thermomechanical problems can arise in such a coaxial connector as a result of differing expansion constants between the inner conductor and connector housing of the connector. These problems manifest as cracks that form in the circuit board conductive pattern and the solder joints by means of which electrical contact is established between the cable and the conductive pattern, resulting in turn in electrical interruptions.

SUMMARY OF THE INVENTION

The purpose of this invention is to provide a coaxial connector of the type described above in which the risk of electrical interruptions resulting from variations in thermal expansion is substantially reduced. This purpose is achieved in that the device contains a longitudinal coupling element that is axially slidably mounted in a recess in the inner conductor and arranged so as to be in capacitive communication with the inner conductor and connected to the conductive pattern, and in that a layer of insulating material is arranged between the coupling element and the recess.

In an application of the invention, the device according to the invention will exhibit the features described in the characterizing sections of claims 2–5.

BRIEF DESCRIPTION OF THE DRAWINGS

The invention will be described in detail below with reference to the accompanying drawing, in which.

DETAILED DESCRIPTION OF THE INVENTION

Figure 1:
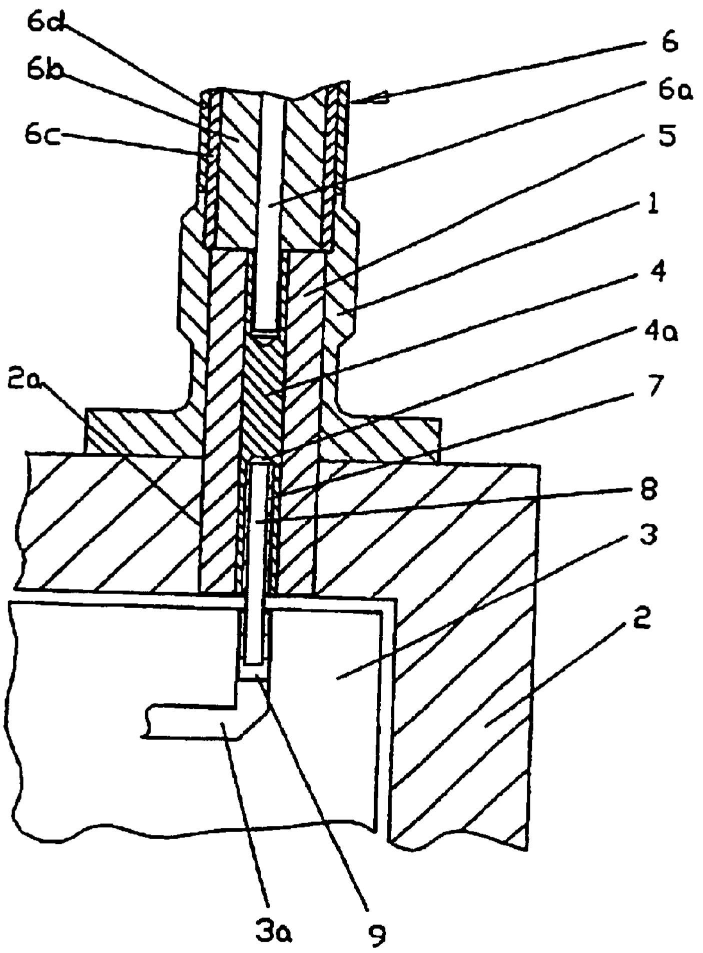
FIG. 1 shows a schematic section of a coaxial connector according to the invention.

In FIG. 1, 1 designates a connector housing made of an electrically conductive material, preferably a metal, that is arranged in contact with a circuit board box 2, in which is mounted a circuit board 3 with a conductive pattern 3*a*. The circuit board box 2, which consists of an electrically conductive material, holds the circuit board 3 in place and functions as a shield for incoming and outgoing radiation. The connector housing 1 contains an inner conductor 4 and, between this and the connector housing 1, an insulating body 5 of an electrically non-conductive material.

6 generally designates a coaxial cable that is connected to the coaxial connector in the usual manner and contains a center conductor 6*a*, insulation 6*b* and a shield 6*c* that is electrically connected with the connector housing, and an insulating jacket 6*d*. In one alternative embodiment (not shown), the coaxial cable lacks the insulating jacket 6*d*.

In the embodiment depicted, the insulating body 5 with the inner conductor 4 slides outside of the connector housing 1 and extends through an opening 2*a* in the circuit card box 2. Alternatively, the circuit board can extend through the opening 2*a* instead of the insulating body 5 with the inner conductor doing so.

According to the invention, there is in the center conductor 4 a recess 4*a* in which is fixedly mounted a socket 7 of an electrically non-conductive material. A longitudinal coupling element 8 made of an electrically conductive material, and of such length that it protrudes outside of the insulation body 5 even when it is entirely inserted into the recess 4*a*, is axially slidably mounted in the socket 7 and connected at its protruding end to the conductive pattern 3*a*, preferably by means of a solder joint 9. The coupling element 8 may of course be connected to the conductive pattern 3*a* in some other manner known to one skilled in the art, such as gluing or welding.

In an alternative embodiment of the invention (not shown), the socket 7 is mounted on the coupling element 8 rather than inside the recess 4*a*.

The coupling element 8 is in capacitive communication with the inner conductor 4, while simultaneously being able to move somewhat relative thereto in order to absorb thermally induced relative movement between the inner conductor 4 and the connector housing 1. The coupling element can also absorb some relative movements between the circuit board 3 and the circuit board box 2.

Because the coupling element is in capacitive communication with the inner conductor 4, the coaxial connector also functions as a dc block, i.e. it prevents low-frequency current from passing.

Figure 2:
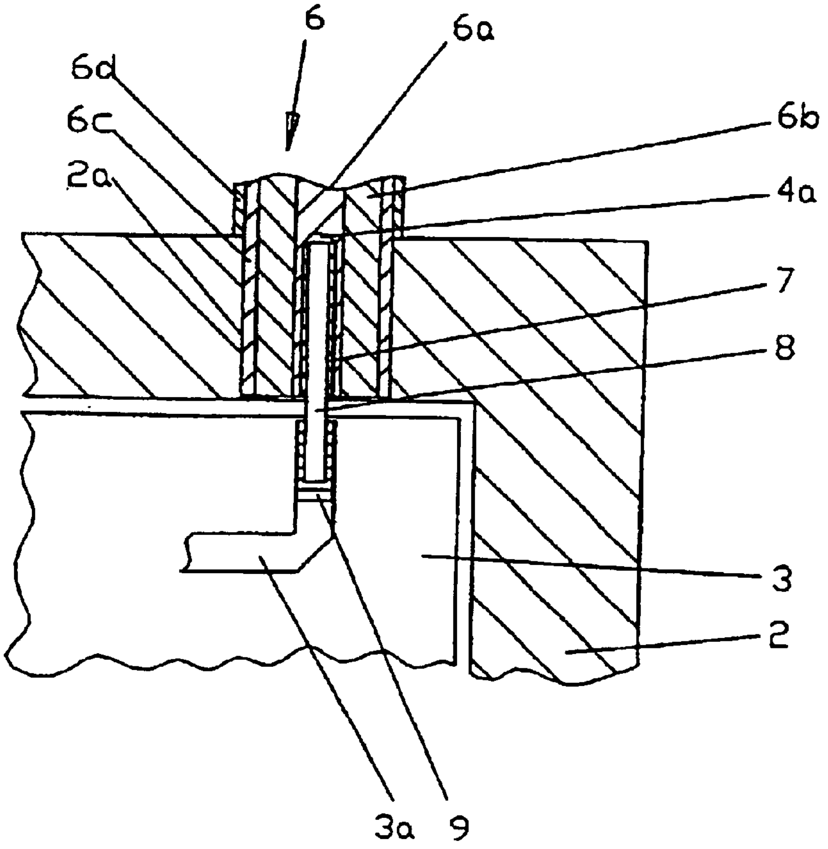
FIG. 2 shows a schematic section of an alternative embodiment of the invention.

In an alternative embodiment of the device according to the invention, which is shown in FIG. 2, the coaxial cable 6 is connected directly to the circuit board 3. In this case the recess 4*a* is made directly in the center conductor 6*a* of the cable 6, and the coupling element 8 is thus in capacitive communication with the center conductor 6*a*. The shield 6*c* of the cable 6 is arranged in contact with the opening 2*a* in the circuit board box 2 and electrically connected thereto.

It will be apparent to one skilled in the art that, within the limits of the idea of the invention, the coupling element 8 can be made long enough to reach, via an opening in the ground plane of a circuit board, a conductive pattern applied to the opposite side of the circuit board.

What is claimed is:

1. A device for a coaxial connection that is intended to connect a coaxial cable to the conductive pattern of a circuit board and contains an outer conductor with an inner conductor that is insulated relative thereto, characterized in that the device contains a longitudinal coupling element that is axially slidably mounted in a recess in the inner conductor and arranged so as to be in capacitive communication with the inner conductor and connected to the conductive pattern, and in that a layer of insulating material is arranged between the coupling element and the recess.

2. A device according to claim 1, characterized in that the outer conductor is a connector housing belonging to the connector.

3. A device according to claim 1, characterized in that the outer conductor is the shield of a coaxial cable.

4. A device according to claim 1, characterized in that the insulating layer is a socket that is fixedly mounted in the recess.

5. A device according to any of the preceding claims, characterized in that the coupling element is connected to the conductive pattern by means of soldering.

6. The device of claim 3 wherein the outer conductor further comprises a connector housing.

7. The device of claim 3 wherein the coaxial cable lacks an insulating jacket.

8. The device of claim 1 wherein the outer conductor comprises a connector housing.

9. The device of claim 8 wherein the insulating layer and inner conductor slide outside of the connector housing to contact the conductive pattern.

10. The device of claim 1 wherein the circuit board is contained within a circuit card box having an opening proximate to the conductive pattern, wherein the insulating layer and inner conductor extend through the opening, and wherein the inner conductor contacts the conductive pattern inside the circuit card box.

11. The device of claim 1 wherein the circuit board is contained within a circuit card box having an opening proximate to the conductive pattern, wherein at least a portion of the circuit board carrying at least a portion of the conductive pattern extends through the opening, and wherein the inner conductor contacts the conductive pattern exterior to the circuit card box.

12. The device of claim 1 wherein the coupling element is of such a length that a portion of the coupling element protrudes outside of the insulating material even when the coupling element is inserted within the insulating material.

13. The device of claim 1 wherein the coupling element is connected to the conductive pattern by gluing.

14. The device of claim 1 wherein the coupling element is connected to the conductive pattern by welding.

15. The device of claim 1 wherein the coupling element is slidably mounted around the inner conductor, wherein the inner conductor is positioned in a recess within the coupling element, and wherein the insulating material is mounted on the inner surface of the recess.

16. The device of claim 1 wherein the coupling element moves relative to the inner conductor to absorb thermally-induced relative movement between the coupling element and inner conductor.

17. The device of claim 10 wherein the coupling element moves relative to the inner conductor to absorb thermally-induced relative movement between the circuit board and the circuit card box.

18. The device of claim 1 which further acts as a dc block.

19. The device of claim 1 wherein the outer conductor and inner conductor insulated relative thereto comprise a coaxial cable having a center conductor, and wherein the recess is arranged within the center conductor.

20. The device of claim 1 wherein the conductive element has a length sufficient to traverse the thickness of a circuit board to connect to a conductive pattern on an opposite side of the circuit board.

* * * * *